US010886340B2

(12) United States Patent
Cai

(10) Patent No.: US 10,886,340 B2
(45) Date of Patent: Jan. 5, 2021

(54) DISPLAY PANEL AND DISPLAY DEVICE WITH REDUCED FRAME WIDTH

(71) Applicant: Wuhan Tianma Micro-Electronics Co., Ltd., Wuhan (CN)

(72) Inventor: Yu Cai, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 16/670,752

(22) Filed: Oct. 31, 2019

(65) Prior Publication Data
US 2020/0381485 A1 Dec. 3, 2020

(30) Foreign Application Priority Data

May 28, 2019 (CN) .......................... 2019 1 0450099

(51) Int. Cl.
H01L 27/32 (2006.01)
G06F 3/041 (2006.01)
H01L 51/52 (2006.01)
G06F 3/044 (2006.01)

(52) U.S. Cl.
CPC .......... H01L 27/323 (2013.01); G06F 3/0412 (2013.01); H01L 51/5253 (2013.01); G06F 3/0446 (2019.05); G06F 3/0448 (2019.05)

(58) Field of Classification Search
CPC . H01L 27/323; H01L 51/5253; G06F 3/0412; G06F 3/0448; G06F 3/0446
See application file for complete search history.

(56) References Cited

U.S. PATENT DOCUMENTS

| 2009/0262095 | A1* | 10/2009 | Kinoshita | G06F 3/044 345/174 |
|---|---|---|---|---|
| 2016/0334910 | A1* | 11/2016 | Ono | G06F 3/0412 |
| 2017/0097727 | A1* | 4/2017 | Wu | G06F 3/0416 |
| 2018/0046301 | A1* | 2/2018 | Zhou | G06F 3/0412 |
| 2018/0053810 | A1* | 2/2018 | Jin | G06F 3/04164 |
| 2018/0182822 | A1* | 6/2018 | Seo | H01L 27/323 |
| 2018/0348929 | A1* | 12/2018 | Rhe | G06F 3/0412 |
| 2019/0115562 | A1* | 4/2019 | Moon | B32B 15/08 |

FOREIGN PATENT DOCUMENTS

CN 106873839 A 6/2017

* cited by examiner

Primary Examiner — Temesghen Ghebretinsae
Assistant Examiner — Ivelisse Martinez Quiles
(74) Attorney, Agent, or Firm — Anova Law Group PLLC

(57) ABSTRACT

A display panel and a display device are provided. The display panel includes a display area and a non-display area including a climbing area. The display panel also includes an array substrate, and a display layer disposed on the array substrate and located in the display area. The display panel also includes a thin film encapsulation layer, located at a side of the display layer away from the array substrate and extending from the display area to the non-display area. The display panel also includes touch signal lines, located at a side of the thin film encapsulation layer away from the display layer. The film encapsulation layer includes a climbing section located in the climbing area. The climbing area includes at least one first subarea. In the first subarea, in the direction from the display area to the non-display area, line widths of the touch signal lines gradually change.

18 Claims, 8 Drawing Sheets

DISPLAY PANEL AND DISPLAY DEVICE WITH REDUCED FRAME WIDTH

CROSS-REFERENCES TO RELATED APPLICATIONS

This application claims priority of Chinese Patent Application No. 201910450099.8, filed on May 28, 2019, the entire content of which is hereby incorporated by reference.

FIELD OF THE DISCLOSURE

The present disclosure generally relates to the field of display technology and, more particularly, relates to display panels and display devices.

BACKGROUND

In current display device technologies, display panels may be generally divided into two major types including liquid crystal display panels and organic light-emitting display panels. An organic light-emitting display panel uses an organic electroluminescent material. When electric current passes through the organic electroluminescent material, the organic luminescent material may emit light, realizing a display function of the organic light-emitting display panel. Since the organic light-emitting display panel may have a self-luminous property, no backlight is needed. Accordingly, thickness reduction and weight reduction of the organic light-emitting display panel may be achieved, and organic light-emitting display technologies become a focus of current research.

With an increasing demand for various functions of electronic products, a touch function is often required to be integrated into an organic light-emitting display panel. In addition, due to a full screen concept proposed in recent years, manufacturers and users may have higher requirements for designing narrow frames for electronic products. Accordingly, there is a need to provide a narrow-frame display device integrated with a touch function.

The disclosed methods and structures are directed to solve one or more problems set forth above and other problems in the art.

SUMMARY

One aspect of the present disclosure includes a display panel. The display panel includes a display area and a non-display area, and the non-display area includes a climbing area. The display panel also includes an array substrate, and a display layer disposed on the array substrate and located in the display area. The display panel also includes a thin film encapsulation layer, located at a side of the display layer away from the array substrate and extending from the display area to the non-display area. The display panel also includes touch signal lines, located at a side of the thin film encapsulation layer away from the display layer. The film encapsulation layer includes a climbing section located in the climbing area. In a direction from the display area to the non-display area, a thickness of the climbing section in a first direction gradually decreases, the first direction being perpendicular to the display panel. At least a part of the touch signal lines is disposed on the climbing section. In the climbing area, the touch signal lines are sequentially arranged in the direction from the display area to the non-display area. A width of one touch signal line in a direction perpendicular to an extending direction of the touch signal line is a line width of the touch signal line. The climbing area includes at least one first subarea, and in the first subarea, in the direction from the display area to the non-display area, the line widths of the touch signal lines gradually change.

Another aspect of the present disclosure includes a display device. The display device includes a display panel including a display area and a non-display area, and the non-display area includes a climbing area. The display panel also includes an array substrate, and a display layer disposed on the array substrate and located in the display area. The display panel also includes a thin film encapsulation layer, located at a side of the display layer away from the array substrate and extending from the display area to the non-display area. The display panel also includes touch signal lines, located at a side of the thin film encapsulation layer away from the display layer. The film encapsulation layer includes a climbing section located in the climbing area. In a direction from the display area to the non-display area, a thickness of the climbing section in a first direction gradually decreases, the first direction being perpendicular to the display panel. At least a part of the touch signal lines is disposed on the climbing section. In the climbing area, the touch signal lines are sequentially arranged in the direction from the display area to the non-display area. A width of one touch signal line in a direction perpendicular to an extending direction of the touch signal line is a line width of the touch signal line. The climbing area includes at least one first subarea, and in the first subarea, in the direction from the display area to the non-display area, the line widths of the touch signal lines gradually change.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

To make the objectives, technical solutions and advantages of the present disclosure more clear and explicit, the present disclosure is described in further detail with accompanying drawings and embodiments. It should be understood that the specific exemplary embodiments described herein are only for explaining the present disclosure and are not intended to limit the present disclosure.

Reference will now be made in detail to exemplary embodiments of the present disclosure, which are illustrated in the accompanying drawings. Wherever possible, the same reference numbers will be used throughout the drawings to refer to the same or like parts.

It should be noted that relative arrangements of components and steps, numerical expressions and numerical values set forth in exemplary embodiments are for illustration purpose only and are not intended to limit the present disclosure unless otherwise specified. Techniques, methods and apparatus known to the skilled in the relevant art may not be discussed in detail, but these techniques, methods and apparatus should be considered as a part of the specification, where appropriate.

Figure 1:
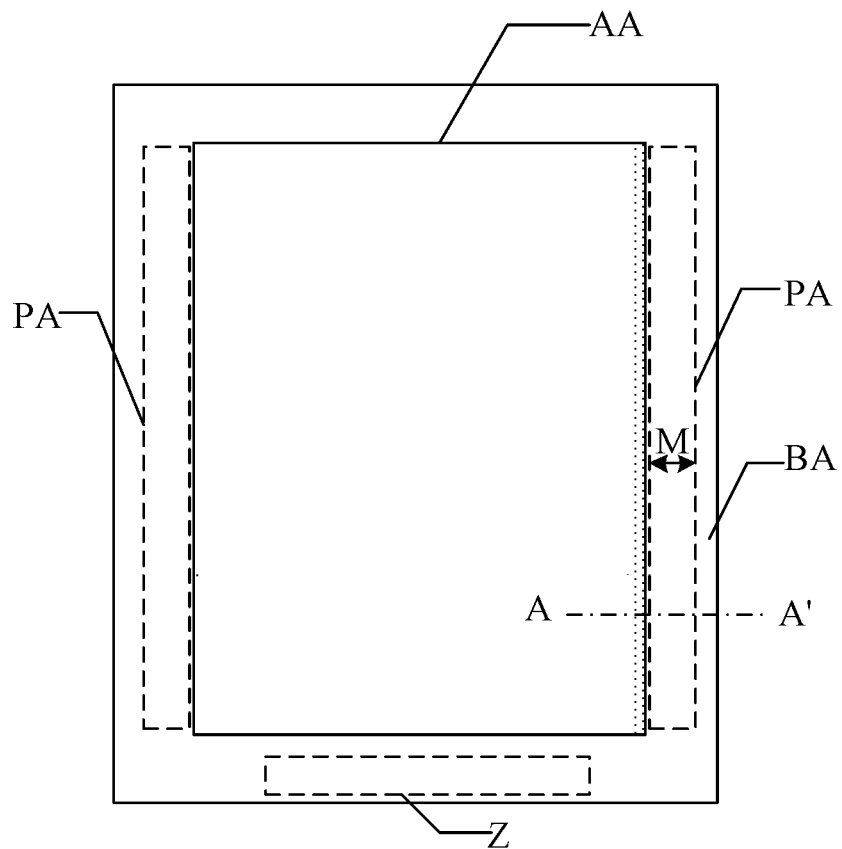
FIG. 1 illustrates a top view of an exemplary display panel consistent with the disclosed embodiments of the present disclosure.
Figure 2:
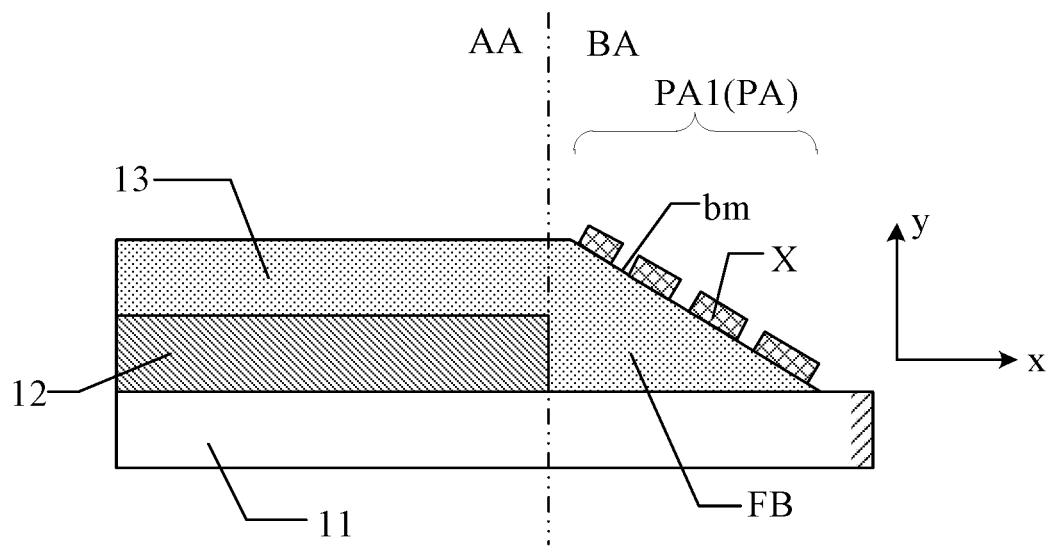
FIG. 2 illustrates an exemplary cross-sectional view at cross section AA' of the exemplary display panel illustrated in FIG. 1, consistent with the disclosed embodiments of the present disclosure.
Figure 3:
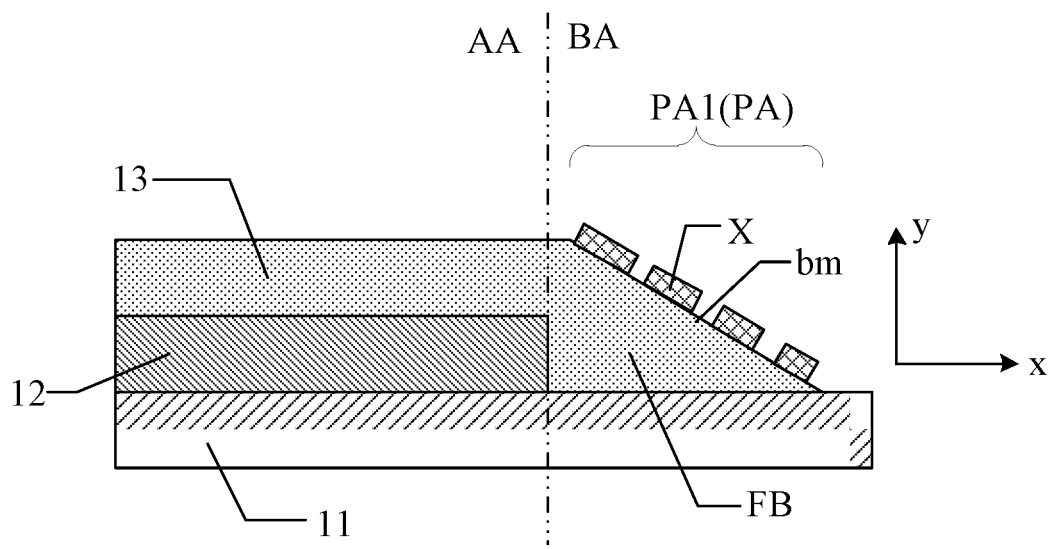
FIG. 3 illustrates another exemplary cross-sectional view at cross section AA' of the exemplary display panel illustrated in FIG. 1, consistent with the disclosed embodiments of the present disclosure.

FIG. 1 illustrates a top view of an exemplary display panel consistent with the disclosed embodiments of the present disclosure. FIG. 2 illustrates an exemplary cross-sectional view at cross section AA' of the exemplary display panel illustrated in FIG. 1. FIG. 3 illustrates another exemplary cross-sectional view at cross section AA' of the exemplary display panel illustrated in FIG. 1.

As shown in FIG. 1, the display panel includes a display area AA and a non-display area BA, and the non-display area BA includes a climbing area PA. In one embodiment, the climbing area PA is adjacent to the display area AA. In some other embodiments, there may be a non-display area between the climbing area PA and the display area AA. Location of the climbing area PA in FIG. 1 is only a schematic representation. In one embodiment, as shown in FIG. 1, the display panel also includes a driving module setting area Z. A driving chip (not shown) may be disposed in the driving module setting area Z. Two climbing areas PA are located at two sides of the display area AA, respectively.

As shown in FIG. 2 and FIG. 3, the display panel also includes an array substrate 11, a display layer 12 on the array substrate 11 and located in the display area AA. The display layer 12 includes a plurality of light emitting components (not shown). Each of the plurality of light emitting components includes an anode, a light emitting layer and a cathode arranged in a stack. The display panel also includes a thin film encapsulation layer 13. The thin film encapsulation layer 13 is located at a side of the display layer 12 away from the array substrate 11 and extends from the display area AA to the non-display area BA. A detailed structure of the thin film encapsulation layer is not illustrated in FIG. 2 and FIG. 3.

In one embodiment, the thin film encapsulation layer 13 includes at least one organic encapsulation layer and at least one inorganic encapsulation layer. The thin film encapsulation layer 13 surrounds and covers the display layer 12. The thin film encapsulation layer 13 may isolate water and oxygen, and thus the illumination components in the display layer 12 may be protected from attack by water and oxygen. The film encapsulation layer 13 includes a climbing section FB, and the climbing section FB is located in the climbing area PA.

In a direction x from the display area AA to the non-display area BA, a thickness of the climbing section FB in a first direction y gradually decreases, the first direction y being perpendicular to the display panel. That is, a thickness of an edge of thin film encapsulation layer 13 located in the non-display area gradually decreases in the direction x from the display area AA to the non-display area BA. The present disclosure does not limit change rules of a gradual decrease of the thickness of the climbing section. That is, in the direction x from the display area AA to the non-display area BA, the thickness of the climbing section may gradually decrease, or the thickness of the climbing section may gradually decrease first, then remain unchanged, and then decrease again.

Figure 4:
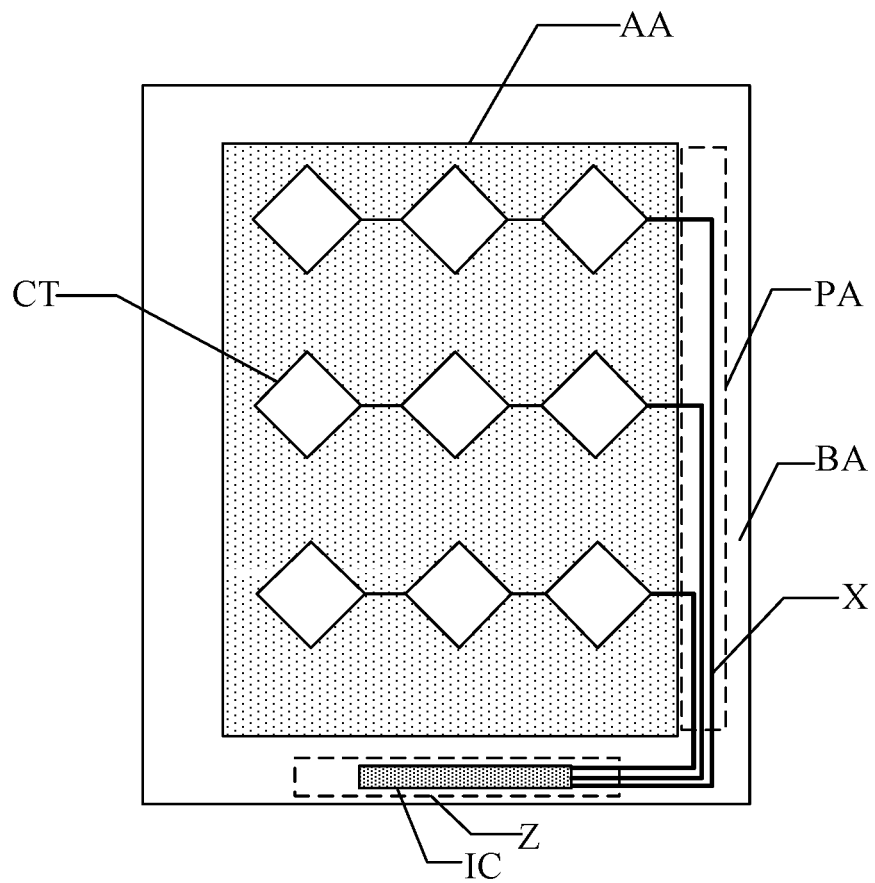
FIG. 4 illustrates an exemplary implementation of an exemplary display panel consistent with the disclosed embodiments of the present disclosure.

Referring to FIG. 2 and FIG. 3, the display panel also includes touch signal lines X located at a side of the thin film encapsulation layer 13 away from the display layer 12. At least a part of the touch signal lines X is disposed on the climbing section FB. FIG. 4 illustrates an exemplary implementation of an exemplary display panel. As shown in FIG. 4, the touch signal lines are connected to a driving chip IC. The touch signal lines may be routed in the non-display area where the climbing section is located, and may also be routed in other non-display areas. In one embodiment, in the non-display area where the climbing section is located, only a part of the touch signal lines X are disposed on the climbing section FB. In some other embodiments, in the non-display area where the climbing section is located, all the touch signal lines X are disposed in the climbing section FB.

FIG. 4 shows an arrangement of the touch signal lines X in the non-display area BA at one side of the display area AA. The display panel includes touch electrodes CT, and one touch signal line X is electrically connected to at least one touch electrode CT. The touch signal lines X are connected to the driving chip IC. The present disclosure does not limit shapes of the touch electrodes, and FIG. 4 is for illustration purpose only. The touch electrodes may have a strip shape or a rhombus shape. FIG. 4 is only a simplified illustration, and line-width changes of the touch signal lines X in the non-display area are not illustrated. For the line-width changes of the touch signal lines X, reference may be made to schematic diagrams shown in FIG. 2 or FIG. 3.

Figure 5:
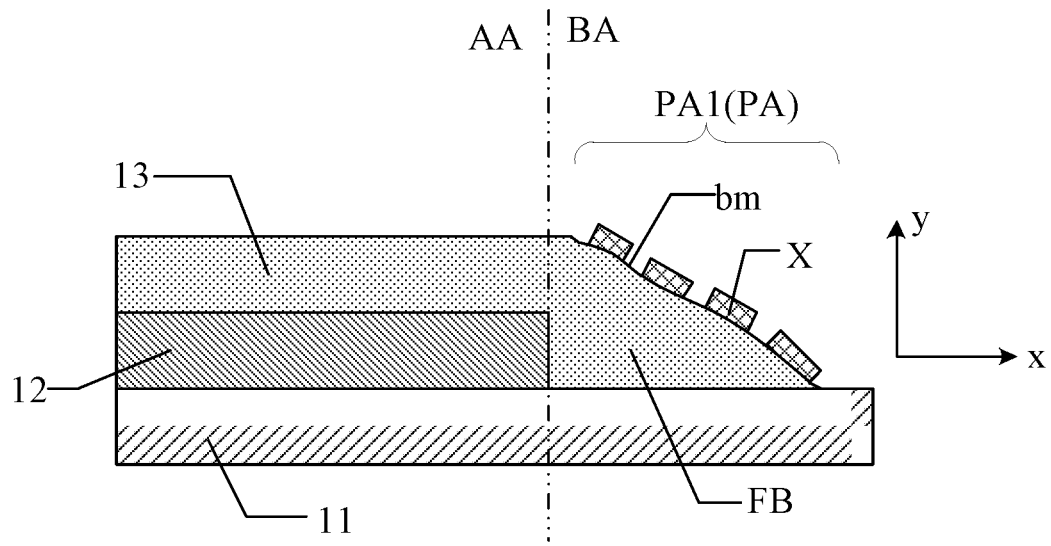
FIG. 5 illustrates another exemplary cross-sectional view at cross section AA' of the exemplary display panel illustrated in FIG. 1, consistent with the disclosed embodiments of the present disclosure.

As shown in FIG. 2 and FIG. 3, in the climbing area PA, the touch signal lines X are sequentially arranged in the direction from the display area AA to the non-display area BA. It should be noted that in the cross-sectional views illustrated in FIG. 2 and FIG. 3, a surface bm of the climbing section FB is a smooth straight line. FIG. 5 illustrates another exemplary cross-sectional view at cross section AA' of the exemplary display panel illustrated in FIG. 1. As shown in the cross-sectional view illustrated in FIG. 5, in an actual display panel, the surface bm of the climbing section FB may have a curved shape.

In the present disclosure, a width of the touch signal line X in a direction perpendicular to an extending direction of the touch signal line X is defined as a line width of the touch signal line X. In the cross-sectional view shown in FIG. 2 or FIG. 3, the surface bm of the climbing section FB is a smooth straight line. A width of the touch signal line in an extending direction of the smooth straight line where the surface of the climbing section FB is located is the line width of the touch-control signal line X.

In one embodiment, as shown in FIG. 5, the surface bm of the climbing section FB may be a curve in the cross-sectional view, and correspondingly, the surface bm may be a curved surface. The touch signal lines X may be disposed on the curved surface. The climbing section may have a plurality of first tangent surfaces tangential to the climbing section. One touch signal line corresponds to one of the first tangent surfaces. At a position where one first tangent surface is tangential to the climbing section, one touch signal line is in contact with the climbing section. A line width direction of the touch signal line is parallel to the first tangent surface and perpendicular to the extending direction of the touch signal line. The line width of the touch signal line is the width of the touch signal line in the line width direction.

In the present disclosure, one touch signal line is in contact with a surface of a portion of the climbing section. When the line width of the touch signal line is narrow, in an enlarged view of the cross section, the surface of the climbing section contacting the touch signal line may be approximately a straight line. A width of the touch signal line in an extending direction of the straight line is the line width. The present disclosure does not limit calculation rules for the line widths of the touch signal lines, provided that a unified calculation rule is used in comparing line widths of different touch signal lines.

In the present disclosure, the climbing area PA includes at least one first subarea PA1. In one embodiment, the first subarea may be only a part of the climbing area. In some other embodiments, an entire climbing area is the first subarea. That is, in the climbing area, the line widths of the plurality of touch signal lines gradually change in the direction from the display area to the non-display area.

In the first subarea, in the direction from the display area AA to the non-display area BA, the line widths of the touch signal lines X gradually change. The present disclosure includes following two cases. In the first case, as shown in FIG. 2, in the first subarea PA1, in the direction from the display area AA to the non-display area BA, the line widths of the touch signal lines X gradually increase. In the second case, as shown in FIG. 3, in the first subarea PA1, in the direction from the display area AA to the non-display area BA, the line widths of the touch signal lines X gradually decrease.

In the present disclosure, the thin film encapsulation layer includes at least one organic encapsulation layer and at least one inorganic encapsulation layer. Due to a high density of an inorganic material, the inorganic encapsulation layer may play a role in blocking water and oxygen. Since an organic material may have good flexibility, the organic encapsulation layer may help to release a stress of the inorganic encapsulation layer and reduce a cracking risk of the inorganic encapsulation layer. A stack arrangement of the organic encapsulation layer and the inorganic encapsulation layer may ensure effectiveness of the overall encapsulation and improve an overall bending resistance of the display panel.

Figure 6:
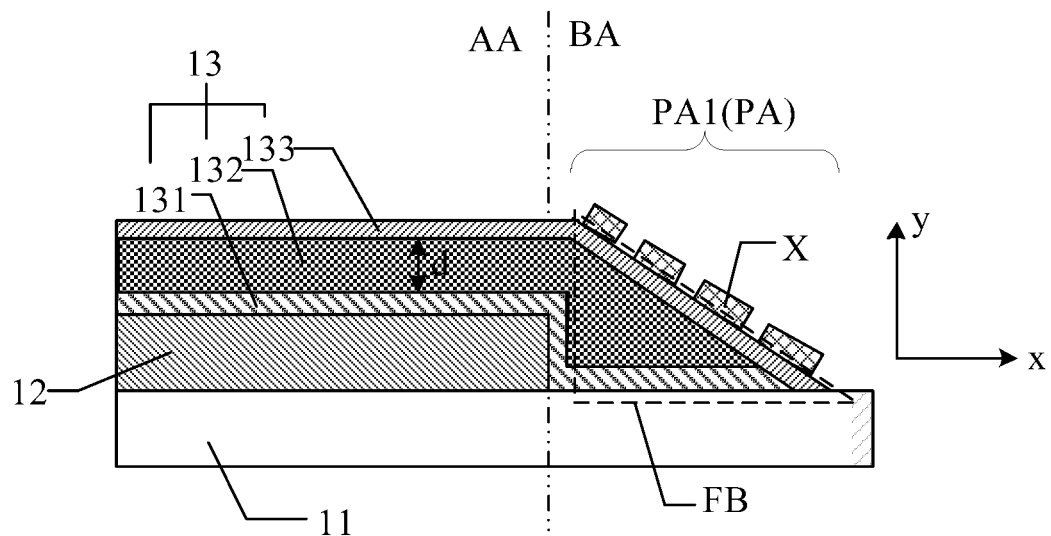
FIG. 6 illustrates another exemplary cross-sectional view at cross section AA' of the exemplary display panel illustrated in FIG. 1, consistent with the disclosed embodiments of the present disclosure.

FIG. 6 illustrates another exemplary cross-sectional view at cross section AA' of the exemplary display panel illustrated in FIG. 1. In one embodiment, as shown in FIG. 6, the thin film encapsulation layer 13 includes a first inorganic encapsulation layer 131, an organic encapsulation layer 132, and a second inorganic encapsulation layer 133 disposed on the display layer 12 in sequence. The inorganic encapsulation layer may be formed by a vapor deposition process. In a direction perpendicular to the display panel, an overall thickness of the inorganic encapsulating layer may be relatively uniform. The organic encapsulating layer 132 may be formed by an inkjet printing process, and an organic encapsulating material may have a certain fluidity during a fabrication process. During a fabrication process, the organic packaging material may spread from the display area to the non-display area, and the thickness of the organic encapsulation material may gradually decrease near an edge. Thus, a slope, i.e. the climbing section in the present disclosure, may be formed at the edge of the thin film encapsulation layer. To ensure an encapsulation effect, an outermost film layer of the thin film encapsulation layer is an inorganic encapsulation layer. A boundary of the outermost inorganic encapsulation layer (corresponding to the second inorganic encapsulation layer 133 in FIG. 6) is located at a side of a boundary of the organic encapsulation layer 132 away from the display area AA.

In a display panel provided by the present disclosure, at least a part of the touch signal lines is disposed on the climbing section of the thin film encapsulation layer. The climbing section is a structure inevitably formed in a manufacturing process for the thin film encapsulation layer. Since the touch signal lines are disposed on the climbing section, a width of the non-display area occupied by the climbing section and the touch signal lines in the direction from the display area to the non-display area may be reduced. Accordingly, narrowing of the non-display area may be achieved.

In the present disclosure, in the first subarea of the climbing area, in the direction from the display area to the non-display area, the line widths of the touch signal lines may gradually change in following two approaches.

In the first approach, the line widths of the touch signal lines gradually increase in the direction from the display area to the non-display area in the first subarea. That is, a touch signal line closer to the edge of the inorganic encapsulation layer has a larger line width. A touch signal line with a larger line width may have a stronger breakage resistance.

In a film layer structure of the thin film encapsulation layer, the inorganic encapsulation layer may have an internal stress caused by film formation. The organic encapsulation layer may alleviate the internal stress of the inorganic encapsulation layer and reduce the cracking risk of the inorganic encapsulation layer. At a position where the climbing section is located, the thickness of the organic encapsulation layer gradually decreases in the direction from the display area to the non-display area. Accordingly, an internal stress alleviation ability of the organic encapsulation layer to the inorganic encapsulation layer gradually decreases in the direction from the display area to the non-display area. At the edge of the inorganic encapsulation layer, edge cracking may occur due to the internal stress which the inorganic encapsulation layer is subjected to. Edge cracks of the inorganic encapsulation layer may further cause a breakage risk of the touch signal line disposed at the edge of the climbing section (the side away from of the display area). That is, at the edge of the inorganic encapsulation layer, the touch signal lines may break due to concentration of internal stress.

In the present disclosure, a touch signal line closer to the edge of the inorganic encapsulation layer has a larger the line width, and a touch signal line with a larger line width may have a stronger resistance to breakage. Thus, a breakage risk of the touch signal line caused by the edge cracks of the inorganic encapsulation layer at a side of the climbing section away from the display area may be reduced. Accordingly, breakage of the touch signal line due to the concentration of internal stress at the edge of the inorganic encapsulation layer may be avoided, and thus reliability of touch performances may be ensured.

In the second approach, in the first subarea, in the direction from the display area to the non-display area, the line widths of the touch signal lines gradually decrease. That is, in the first subarea, a touch signal line closer the display area has a larger line width. That is, a touch signal line, disposed at a location of the thin film encapsulation layer with a larger thickness, has a larger line width. A touch signal line with a larger line width may have a stronger bending resistance.

When the first subarea of the display panel is in a bending state, the film encapsulation layer is subjected to a bending stress caused by an external force. A thin film encapsulation layer with a larger thickness has a larger bending stress. Accordingly, a touch signal line disposed on a position of the thin film encapsulation layer with a larger thickness in the climbing area may have a higher risk of bending and breaking. That is, during a bending process, a touch signal line disposed at a position of a thin film encapsulation layer with a larger thickness may break due to a bending stress.

In this approach, a touch signal line disposed at a position of the thin film encapsulation layer with a larger thickness has a larger line width. Accordingly, during a bending process, a breakage risk, due to bending stress, of a touch signal line at a position of the thin film encapsulation layer with a larger thickness may be reduced. Thus, during a bending process, breakage, due to bending stress, of a touch signal line disposed at a position of the thin film encapsulation layer with a larger thickness may be avoided, and thus the reliability of touch performances may be ensured.

With continued reference to FIG. 6, in the display area AA, in a first direction y, a thickness d of the organic encapsulation layer 132 is in a range of approximately 4 µm≤d≤16 µm. When the thickness of the organic encapsulation layer is less than approximately 4 µm, since the organic encapsulation layer is too thin, the thickness of the organic encapsulation layer in the display area produced by an inkjet printing process may be uneven, and the display quality may be affected. In addition, if the thickness of the organic encapsulation layer is too small, the ability of alleviating the stress of the inorganic encapsulation layer may be weak. When the thickness of the organic encapsulation layer is larger than approximately 16 µm, the organic encapsulation layer may be thick enough to effectively alleviate the stress in the inorganic encapsulation layer. However, due to an excessive thickness of the organic encapsulation layer, an overall thickness of the thin film encapsulation layer may be large, and thus an overall thickness of the display panel may be affected. In the present disclosure, the thickness d of the organic encapsulation layer 132 is in a range of approximately 4 µm≤d≤16 µm. Thus, the organic encapsulation layer has a certain thickness to effectively alleviate the stress of the inorganic encapsulation layer. Meanwhile, thickness uniformity of the organic encapsulation layer in the display area prepared by the inkjet printing process may be ensured. Moreover, the thin film encapsulation layer may be relatively thin overall, and thickness reduction of the display panel may be achieved.

In one embodiment, in the first subarea, in the direction from the display area to the non-display area, the line width of the touch signal lines gradually changes, and a spacing between two adjacent touch signal lines gradually changes. A change rule of the line width may be opposite to a change rule of the spacing. In one embodiment, in the first subarea, in the direction from the display area to the non-display area, the line widths of the touch signal lines gradually increase, and the spacings between two adjacent touch signal lines gradually decrease. In some other embodiments, in the first subarea, in the direction from the display area to the non-display area, the line widths of the touch signal lines may gradually decrease, and the spacings between adjacent two touch signal lines may gradually increase. Following embodiments detail the change rules of the line widths of the touch signal lines in the first subarea and the change rules of the spacings between two adjacent touch signal lines.

In one embodiment, with reference to FIG. 2, in the first subarea, in the direction from the display area to the non-display area, the line widths of the touch signal lines gradually increase. Accordingly, in the first subarea, a breakage resistance of the touch signal line gradually increases in the direction from the display area to the non-display area. Thereby, a breakage risk of the touch signal lines due to the edge cracks of the inorganic encapsulation layer at a side of the inorganic encapsulation layer away from the display area may be reduced, and the reliability of touch performances may be thus ensured.

Further, in the present disclosure, the climbing section includes a first portion, and the first portion is located in the first subarea. In the first subarea, in the direction from the display area to the non-display area, a width of the first portion is $M_1$, a maximum thickness of the first portion in the first direction is $d_{max}$, and $\tan \alpha 1 = d_{max}/M_1$, where $\alpha 1$ is a slope angle of the first portion. In the first subarea, in the direction from the display area to the non-display area, the touch signal lines sequentially include a first touch signal line, a second touch signal line, a third touch signal line to an n-th touch signal line. Correspondingly, line widths of the touch signal lines are $L_1$, $L_2$, $L_3$ to $L_n$ respectively, where $L_m - d\ L_{m-1} = L_{m-1} * q * \tan \alpha 1$, $0 < q * \tan \alpha 1 < 1$, $2 \le m \le n$, q is a positive number, and m and n are integers. In one embodiment, the slope angle is in a range of approximately $\alpha 1 \ge 10°$. When the slope angle is too small, a space occupied by the first subarea in the direction x may be large, and thus narrowing of the non-display area may not be achieved.

Figure 7:
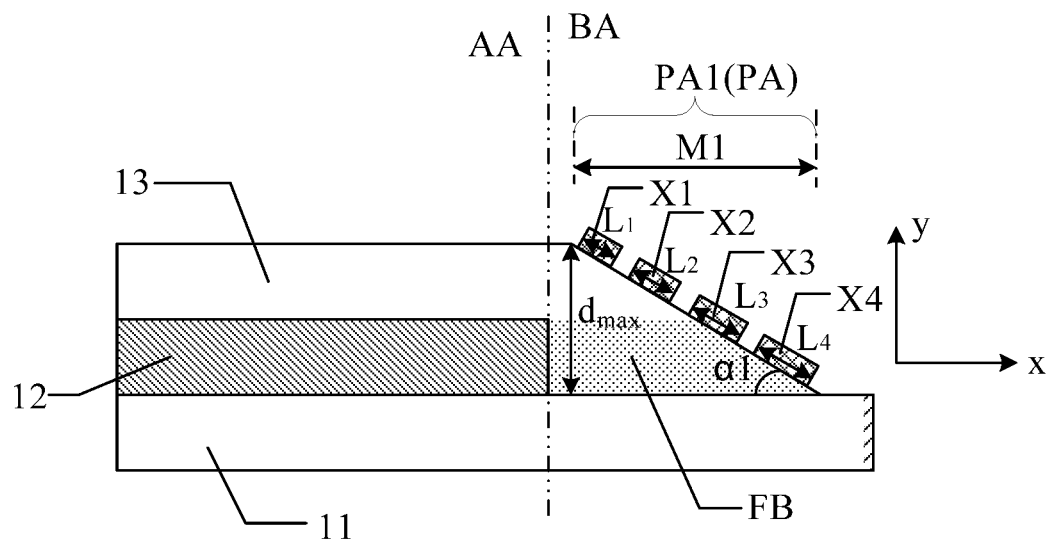
FIG. 7 illustrates another exemplary cross-sectional view at cross section AA' of the exemplary display panel illustrated in FIG. 1, consistent with the disclosed embodiments of the present disclosure.

FIG. 7 illustrates another exemplary cross-sectional view at cross section AA' of the exemplary display panel illustrated in FIG. 1. In one embodiment, as shown in FIG. 7, the climbing area PA entirely is a first subarea PA1. In the first subarea PA1, in the direction x from the display area AA to the non-display area BA, a width of the climbing section FB is $M_1$, a height of the climbing section FB in the first direction y is $d_{max}$, and $\tan \alpha 1 = d_{max}/M_1$, where $\alpha 1$ is a slope angle of the climbing section. It may be understood that when the climbing area PA includes a plurality of sections, the slope angles of the climbing sections FB in different sections may be different. Concepts of slope surface and slope angle in the present disclosure may be understood with reference to the prior art.

Only four touch signal lines are illustrated in FIG. 7, and the four touch signal lines include a first touch signal line X1, a second touch signal line X2, a third touch signal line X3, and a fourth touch signal line X4. For calculation of line width of the touch signal lines, reference may be made to any of the above descriptions for the line width calculation.

In the present disclosure, there are certain relationships between line widths of two adjacent touch signal lines. For example, the line width of the second touch signal line X2 is $L_2$, and the line width of the third touch signal line X3 is $L_3$, where, $L_3 - L_2 = L_2 * q * \tan \alpha 1$, $0 < q * \tan \alpha 1 < 1$, $2 \le m \le n$, q is a positive number, and m and n are integers. In one embodiment, $0 < q * \tan \alpha 1 < 1$. When a value of $\alpha 1$ is determined, a value of q may be chosen according to a range determined by $0 < q * \tan \alpha 1 < 1$.

When $q * \tan \alpha 1 = 1$, $L_m = 2 * L_{m-1}$. That is, the line width difference between two adjacent touch signal lines is the line width of the touch signal line having a smaller line width. Accordingly, the line width difference may be large. Though the line width may gradually change, to ensure that the two adjacent touch signal lines are insulated from each other, the two touch signal lines need to be separated by a certain distance. Because the line width difference between the two adjacent touch signal lines may be large, a space in the non-display area occupied by the touch signal lines overall may be large, and thus narrowing of the display panel frame may not be achieved. When $q * \tan \alpha 1 = 0$, $L_m = L_{m-1}$. That is, the line widths of the adjacent two touch signal lines are equal, and thus gradual change of the line widths may not be realized.

In the present disclosure, $0 < q * \tan \alpha 1 < 1$, and so $0.5 * L_m < L_{m-1} < L_m$ may be achieved. The line widths of the touch signal lines may gradually increase in the direction from the display area to the non-display area, and the line width difference between two adjacent touch signal lines may not be too large. Accordingly, the space occupied by the touch signal lines overall in the non-display area may be small, and frame narrowing of a display panel may be achieved.

Figure 8:
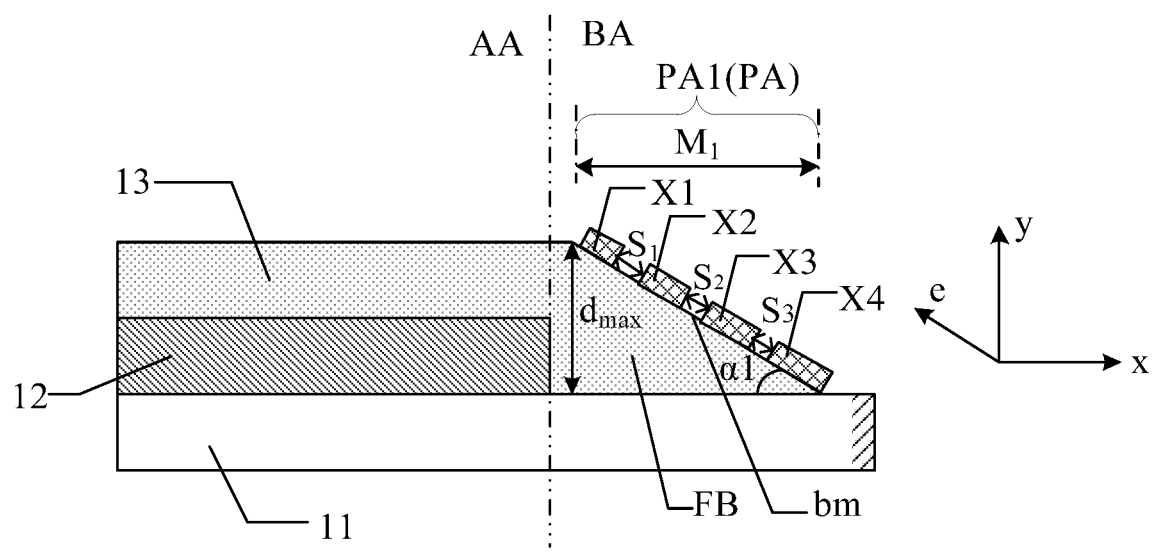
FIG. 8 illustrates another exemplary cross-sectional view at cross section AA' of the exemplary display panel illustrated in FIG. 1, consistent with the disclosed embodiments of the present disclosure.

FIG. 8 illustrates another exemplary cross-sectional view at cross section AA' of the exemplary display panel illustrated in FIG. 1. In one embodiment, as shown in FIG. 8, in the first subarea PA1, in the direction from the display area AA to the non-display area BA, the line widths of the touch signal lines X gradually increase, and the spacings between two adjacent touch signal lines X gradually decrease. In one embodiment, relationships between the line widths of adjacent two touch signal lines X may satisfy the description of the exemplary embodiment illustrated in FIG. 7.

FIG. 8 only illustrates a case where the surface bm of the climbing section FB is a smooth straight line in the cross-sectional view. The implementation approach illustrated in FIG. 8 may be also applicable to a case where the surface bm of the climbing section FB is a curve in the sectional view as shown in FIG. 5.

Further, in the present disclosure, in the first subarea PA1, in the direction from the display area to the non-display area, a width of the climbing section is $M_1$, a height of the climbing section in the first direction is $d_{max}$, $\tan \alpha 1 = d_{max}/M_1$, where $\alpha 1$ is the slope angle of the climbing section. In the first subarea, in the direction from the display area to the non-display area, touch signal lines sequentially include a first touch signal line, a second touch signal line, a third touch signal line to the n-th touch signal line. A spacing between the (m−1)-th touch signal line and the m-th touch signal line is $S_{m-1}$, and a spacing between the m-th touch signal line and the (m+1)-th touch signal line is $S_m$, where $S_{m-1} - S_m = S_{m-1} * q * \tan \alpha 1$, $0 < q * \tan \alpha 1 < 1$, $2 \le m \le n$, q is a positive number, and m and n are integers.

Referring to the illustration in FIG. 8, only four touch signal lines are illustrated in FIG. 8, and the four touch signal lines includes a first touch signal line X1, a second touch signal line X2, a third touch signal line X3, and a fourth touch signal line X4. FIG. 8 only illustrates a case where the surface of the climbing section FB in the cross-sectional view is a smooth straight line. An extension direction of the straight line of the surface bm of the climbing section FB in the cross-sectional view is a direction e. A distance between two adjacent touch signal lines in the direction e is the spacing between the adjacent two touch signal lines.

As shown in FIG. 8, a spacing between the first touch signal line X1 and the second touch signal line X2 is $S_1$, and a spacing between the second touch signal line X2 and the third touch signal line X3 is $S_2$, and a spacing between the third touch signal line X3 and the fourth touch signal line X4 is $S_3$. In one embodiment, $S_m - S_{m-1} = S_{m-1} * q * \tan \alpha 1$, $0 < q * \tan \alpha 1 < 1$. When $q * \tan \alpha 1 = 1$, $S_{m-1} - S_m = S_{m-1}$, and thus $S_m = 0$. For example, when m=2, the spacing between the first touch signal line X1 and the second touch signal line X2 is $S_1$, and the spacing between the second touch signal line X2 and the third touch signal line X3 is $S_2$, where $S_2 = 0$. Since the spacing between the second touch signal line X2 and the third touch signal line X3 is zero, the second touch signal line X2 and the third touch signal line X3 are short-circuited, and thus the touch function may be abnormal. When $q * \tan \alpha 1 = 0$, $S_{m-1} = S_m$, that is, the spacing between two adjacent touch signal lines is equal. Gradual change of the spacings between two adjacent touch signal lines may not be realized.

In the present disclosure, the spacing between the touch signal lines satisfy a certain relationship, and $0 < q * \tan \alpha 1 < 1$. In this configuration, the spacing between two adjacent touch signal lines may be sufficiently large to avoid a short circuit between two adjacent touch signal lines. Meanwhile, under the condition that adjacent touch signals are insulated from each other, the spacings between adjacent touch signal lines gradually decrease. Accordingly, a space occupied by the touch signal lines, arranged in the non-display area, overall may be reduced.

It should be noted that, in a case where the surface bm of the climbing section FB in the cross-sectional view is a curve (refer to FIG. 5), the spacing between the touch signal lines may also satisfy the above formulas, provided that a unified calculation method is used in calculating the spacing between two adjacent touch signal lines. In one embodiment, the climbing section has a plurality of second tangent planes that are tangential to the climbing section. A spacing direction between two adjacent touch signal lines is parallel to the second tangent plane and perpendicular to the extending direction of the touch signal lines. A spacing between two adjacent touch signal lines is a separation distance between two adjacent touch signal lines in the spacing direction.

In one embodiment, as shown in FIG. 3, in the first subarea, in the direction from the display area to the non-display area, the line widths of the touch signal lines gradually decrease. In this configuration, in the first subarea, a touch signal line disposed at a position with a thicker thin film encapsulation layer may have a larger line width, and a touch signal line with a larger line width may have a stronger bending resistance. Accordingly, a touch signal line disposed at a position with a thicker thin film encapsulation layer may have a stronger bending resistance. Thus, during a bending process, a cracking risk of the touch signal line due to a bending stress may be reduced at a position where the thin film encapsulation layer is thick, and breakage of the touch signal line due to a bending stress may be avoided at a position where the thin film encapsulation layer is thick. Reliability of touch performances may thus be ensured.

Further, in the first subarea PA1, in the direction from the display area AA to the non-display area BA, a width of the climbing section FB is $M_1$, a height of the climbing section FB in a first direction is $d_{max}$, $\tan \alpha 1 = d_{max}/M_1$, where $\alpha 1$ is a slope angle of the climbing section. In the first subarea, in the direction from the display area to the non-display area, the touch signal lines sequentially include a first touch signal line, a second touch signal line, a third touch signal line to an n-th touch signal line. The line width of the signal line is respectively $L_1$, $L_2$, $L_3$ to $L_n$ in sequence, where $L_{m-1} - L_m = L_{m-1} * q * \tan \alpha 1$, $0 < q * \tan \alpha 1 < 1$, $2 \leq m \leq n$, q is a positive number, and m and n are integers.

Figure 9:
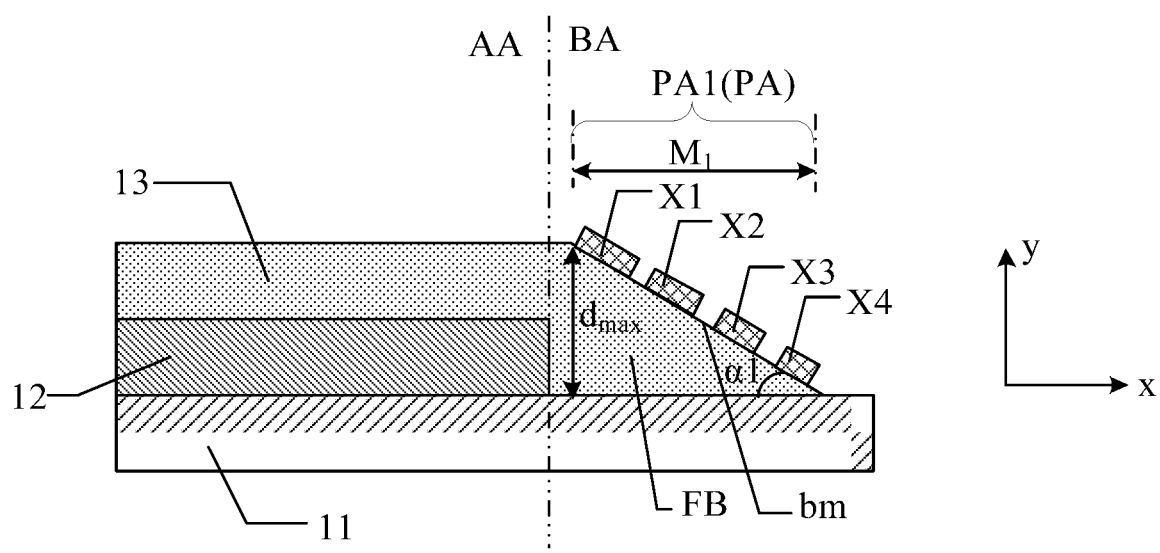
FIG. 9 illustrates another exemplary cross-sectional view at cross section AA' of the exemplary display panel illustrated in FIG. 1, consistent with the disclosed embodiments of the present disclosure.

FIG. 9 illustrates another exemplary cross-sectional view at cross section AA' of the exemplary display panel illustrated in FIG. 1. In FIG. 9, as an example, the entire climbing area is a first subarea. In the first subarea, in the direction from the display area AA to the non-display area BA, a width of the climbing section FB is $M_1$, a height of the climbing section FB in a first direction y is $d_{max}$, $\tan \alpha_1 = d_{max}/M_1$, where $\alpha 1$ is a slope angle of the climbing section. It may be understood that when the climbing area PA includes a plurality of partitions, the slope angle of the climbing section FB at each of the plurality of partitions may be different. Concepts of the slope surface and the slope angle in the present disclosure may be understood with reference to the prior art.

Only four touch signal lines are illustrated in FIG. 9, and the four touch signal lines includes a first touch signal line X1, a second touch signal line X2, a third touch signal line X3, and a fourth touch signal line X4. FIG. 9 only illustrates a case where the surface bm of the climbing section FB in the cross-sectional view is a straight line. In this configuration, a width of the touch signal line, in a direction parallel to the surface bm of the climbing section FB and perpendicular to the extension direction of the touch signal line, is the line width of the touch signal line.

In one embodiment, $0 < q * \tan \alpha 1 < 1$. When a value of $\alpha 1$ is determined, a value of q may be chosen according to the formula $0 < q * \tan \alpha 1 < 1$. When $q * \tan \alpha 1 = 1$, $L_{m-1} - L_m = L_{m-1}$, that is $L_m = 0$. Taking m=2 as an example, the line width of the first touch signal line X1 is $L_1$, and the line width of the second touch signal line X2 is $L_2$ with $L_2 = 0$. Obviously, a touch signal line with a zero line width cannot be used to transmit a touch signal. In this case, though a gradual decrease of the line widths of the touch signal lines may be achieved, the line widths of the touch signal lines may be too small, and thus the ability for transmitting touch signals may be lost. When $q * \tan \alpha 1 = 0$, $L_m = L_{m-1}$. That is, the line widths of the adjacent two touch signal lines are equal, and gradual change of the line widths may not be achieved.

In the present disclosure, $0 < q * \tan \alpha 1 < 1$. In the direction from the display area to the non-display area, the line widths of the touch signal lines gradually decrease, and the line width of the touch signal line disposed at a position with a thicker thin film encapsulation layer has a larger line width. Accordingly, the breakage risk of the touch signal line, disposed at a thicker portion of the thin film encapsulation layer, due to a bending stress in a bending process may be reduced, and thus reliability of touch performances may be ensured. At a same time, under a condition of gradual decrease of the line widths of the touch signal lines, the line widths of the touch signal lines may be ensured to have a certain value. Accordingly, signal transmission abilities of the touch signal lines may be ensured.

FIG. 9 only illustrates a case where the surface bm of the climbing section FB is a straight line in the cross-sectional view. The above formulas may be also applied to a case where the surface bm of the climbing section FB in the sectional view is a curve. Details are not described here again.

Figure 10:
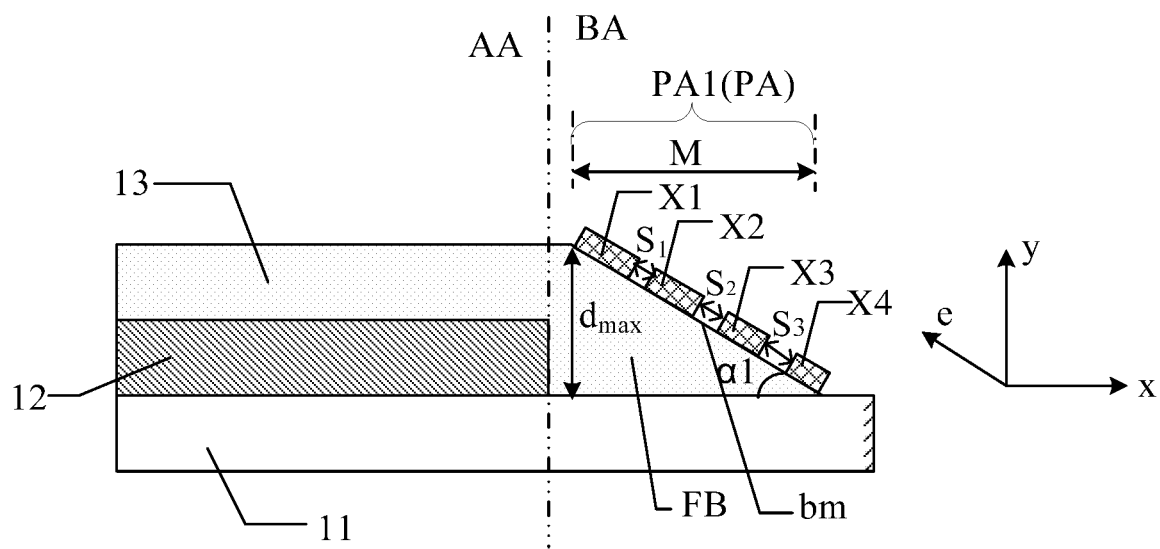
FIG. 10 illustrates another exemplary cross-sectional view at cross section AA' of the exemplary display panel illustrated in FIG. 1, consistent with the disclosed embodiments of the present disclosure.

FIG. 10 illustrates another exemplary cross-sectional view at cross section AA' of the exemplary display panel illustrated in FIG. 1. In one embodiment, as shown in FIG. 10, in the first subarea PA1, in the direction from the display area AA to the non-display area BA, line widths of the touch signal lines X gradually decrease, and spacings between the two adjacent touch signal lines X gradually increase. In one embodiment, relationship between the line widths of two adjacent touch signal lines may satisfy the description of the exemplary embodiment illustrated by FIG. 9.

Further, in the first subarea, in the direction from the display area AA to the non-display area BA, a width of the climbing section is $M_1$, a height of the climbing section FB in the first direction is $d_{max}$, and $\tan \alpha 1 = d_{max}/M_1$, where $\alpha 1$ is a slope angle of the climbing section. In the first subarea, in the direction from the display area to the non-display area, touch signal lines sequentially include a first touch signal line, a second touch signal line, a third touch signal line to an n-th touch signal line. A spacing between the (m−1)-th touch signal line and the m-th touch signal line is $S_{m-1}$, and a spacing between the m-th touch signal line and the (m+1)-th touch signal line is $S_m$, where $S_m - S_{m-1} = S_{m-1} * q * \tan \alpha 1$, $0 < q * \tan \alpha 1 < 1$, $2 \leq m \leq n$, q is a positive number, and m and n are integers.

Referring to FIG. 10, only four touch signal lines are illustrated in FIG. 10, and the four touch signal lines includes a first touch signal line X1, a second touch signal line X2, a third touch signal line X3, and a fourth touch signal line X4. FIG. 10 only illustrates a case where a surface (i.e. slope) of the climbing section FB in the cross-sectional view is a smooth straight line. In this case, an extension direction of the straight line where the surface bm of the climbing section FB is located is a direction e. A distance between two touch signal lines in the direction e is a spacing between the two touch signal lines.

As shown in FIG. 10, the spacing between the first touch signal line X1 and the second touch signal line X2 is $S_1$, the spacing between the second touch signal line X2 and the third touch signal line X3 is $S_2$, and the spacing between the third touch signal line X3 and the fourth touch signal line X4 is $S_3$. In one embodiment, $S_m - S_{m-1} = S_{m-1} * q * \tan \alpha 1$, and $0 < q * \tan \alpha 1 < 1$. When $q * \tan \alpha 1 = 1$, $S_m = 2 * S_{m-1}$. Taking m=2 as an example, the spacing between the second touch signal line X2 and the third touch signal line X3 is twice the spacing between the first touch signal line X1 and the second touch signal line X2. Though the spacings gradually increase in the direction from the display area to the non-display area, a change range of the spacings may be large. Accordingly, the spacings between two adjacent touch signal lines on a side away from the display area may be too large, and eventually a space occupied by the touch signal lines arranged in the non-display area overall may be affected, and frame narrowing of the display panel may not be achieved. When $q^*\tan \alpha 1=0$, $S_m=S_{m-1}$. That is, the spacings between two adjacent touch signal lines are equal, and thus gradual change of the distances may not be achieved.

In the present disclosure, $0<q^*\tan \alpha 1<1$, and thus $S_{m-1}<S_m<2S_{m-1}$ may be achieved. Accordingly, in the direction from the display area to the non-display area, the spacings between two adjacent touch signal lines may gradually increase. The spacings between two adjacent touch signal lines at the side away from the display area may not be too large, and the touch signal lines overall may not occupy a large space in the non-display area. Thus, frame narrowing of the display panel may be achieved.

Figure 11:
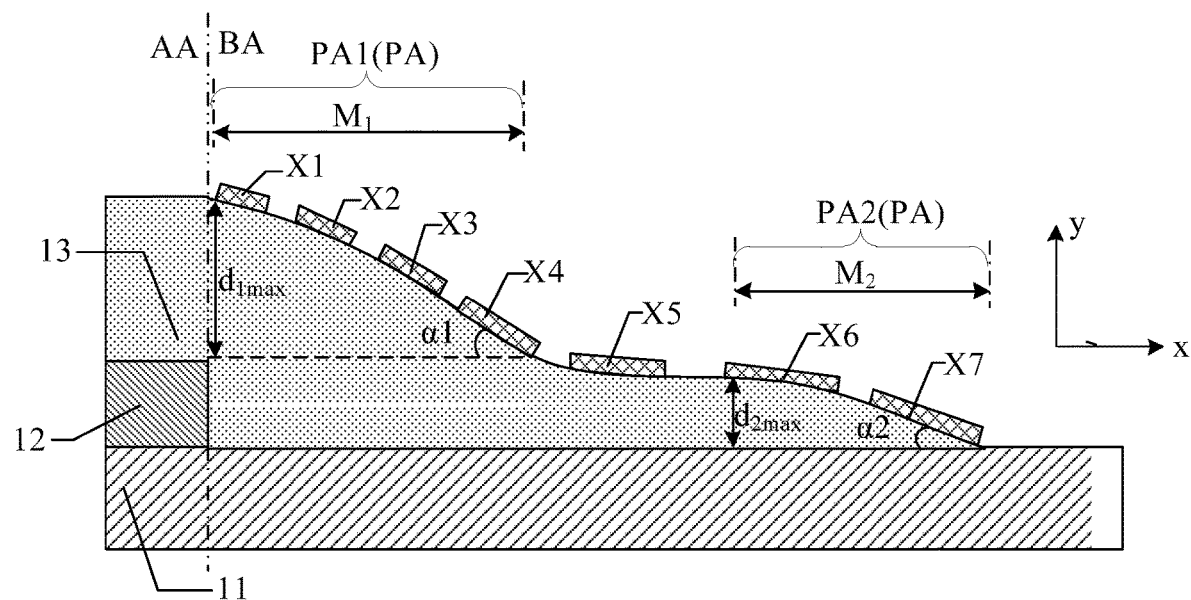
FIG. 11 illustrates another exemplary cross-sectional view at cross section AA' of the exemplary display panel illustrated in FIG. 1, consistent with the disclosed embodiments of the present disclosure.

FIG. 11 illustrates another exemplary cross-sectional view at cross section AA' of the exemplary display panel illustrated in FIG. 1. In one embodiment, as shown in FIG. 11, the climbing area PA includes a first subarea PA1 and a second subarea PA2. In the first subarea PA1, in the direction x from the display area AA to the non-display area BA, a width of the climbing section FB is $M_1$, a height of the climbing section FB in the first direction y is $d_{1max}$, and tan $\alpha 1 = d_{1max}/M_1$, where $\alpha 1$ is a slope angle of the climbing section FB in the first subarea PA1. In the second subarea PA2, in the direction x from the display area AA to the non-display area BA, a width of the climbing section FB is $M_2$, a height of the climbing section FB in the first direction y is $d_{2max}$, and tan $\alpha 2 = d_{2max}/M_2$, where $\alpha 2$ is a slope angle of the climbing section FB in the second subarea PA2, and $\alpha 1 > \alpha 2$. Change trends of the line widths of the touch signal lines in the first subarea PA1 and the second subarea PA2 are consistent.

In one embodiment, as shown in FIG. 11, in the direction from the display area AA to the non-display area BA, the touch signal lines include a first touch signal line X1, a second touch signal line X2, to a seventh touch signal line X7. The seven touch signal lines are disposed in sequence, and the line widths of the seven touch signal lines gradually increase. The first to the fourth touch signal lines are located in the first subarea PA1, and the sixth and the seventh touch signal lines are located in the second subarea PA2.

In one embodiment, the climbing area includes at least a first subarea and a second subarea having different slope angles. A flat zone may exist between the first subarea and the second subarea, or the first subarea may be directly connected to the second subarea. That is, in the direction from the display area to the non-display area, slopes of the climbing section may be inconsistent. In an area in the climbing section where the slope is large, the slope surface (the surface of the climbing section) is relatively steep, and in the area in the climbing section where the slope is small, a corresponding slope is relatively flat. In an actual implementation, the climbing section may be divided into subsections and a slope rate of each sub-section may be designed to meet different design requirements at different locations.

It should be noted that FIG. 11 only illustrates a case where the line widths of the touch signal lines gradually increase in the direction from the display area to the non-display area, and does not illustrate a case where the line widths of the touch signal lines gradually decrease. In FIG. 11, the first subarea is located at a side of the second subarea facing the display area. In some other embodiments, the second subarea may be located at a side of the first subarea facing the display area.

Figure 12:
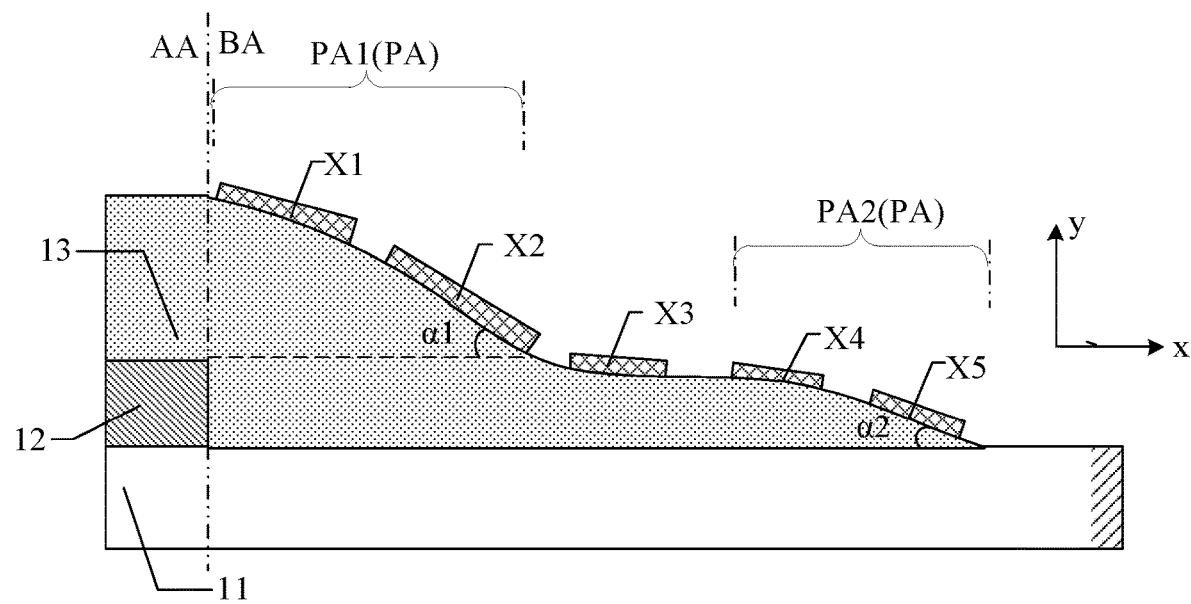
FIG. 12 illustrates another exemplary cross-sectional view at cross section AA' of the exemplary display panel illustrated in FIG. 1, consistent with the disclosed embodiments of the present disclosure.

In one embodiment, $\alpha 2 \geq 10°$. If the slope angle is too small, a space occupied by the second subarea in the direction x may be large, and thus narrowing of the non-display area may not be achieved. FIG. 12 illustrates another exemplary cross-sectional view at cross section AA' of the exemplary display panel illustrated in FIG. 1. In one embodiment, as shown in FIG. 12, $\alpha 1 > \alpha 2$, that is, the slope of the first subarea PA1 is greater than the slope of the second subarea PA2. Change trends of the line widths of the touch signal lines in the first subarea PA1 and the second subarea PA2 are same. For example, in both the first subarea PA1 and the second subarea PA2, the line widths gradually increase in a direction from the display area to the non-display area. As an example, the structure includes five signal lines including a first touch signal line X1 to a fifth touch signal line X5. Line widths of the touch signal lines in the first subarea PA1 are larger than line widths of the touch signal lines in the second subarea PA2. The first subarea PA1 is a steeper than the second subarea PA2, and the second subarea PA2 is a relatively flat area.

In a process of disposing the touch signal lines, a fluidity of an etchant in a relatively steep region may be large, and thus the region that is relatively steep may be over-etched. Accordingly, the line width of touch signal lines eventually disposed in the region that is relatively steep may have a large error, and a breakage risk of the touch signal lines may increase. In one embodiment, the line widths of the touch signal lines in the first subarea PA1 are larger than the line widths of the touch signal lines PA2 in the second subarea PA2. As such, errors due to over-etching in the first subarea PA2 may be decreased.

In one embodiment, in the first subarea, in the direction from the display area to the non-display area, a line-width difference between two adjacent touch signal lines is $\Delta D_1$, and a spacing difference between two adjacent spacings is $\Delta S_1$. In the second subarea, in the direction from the display area to the non-display area, the line-width difference between two adjacent touch signal lines is $\Delta D_2$, and the spacing difference between two adjacent spacings is $\Delta S_2$, where $\Delta D_1 > \Delta D_2$ and $\Delta S_1 > \Delta S_2$.

Figure 13:
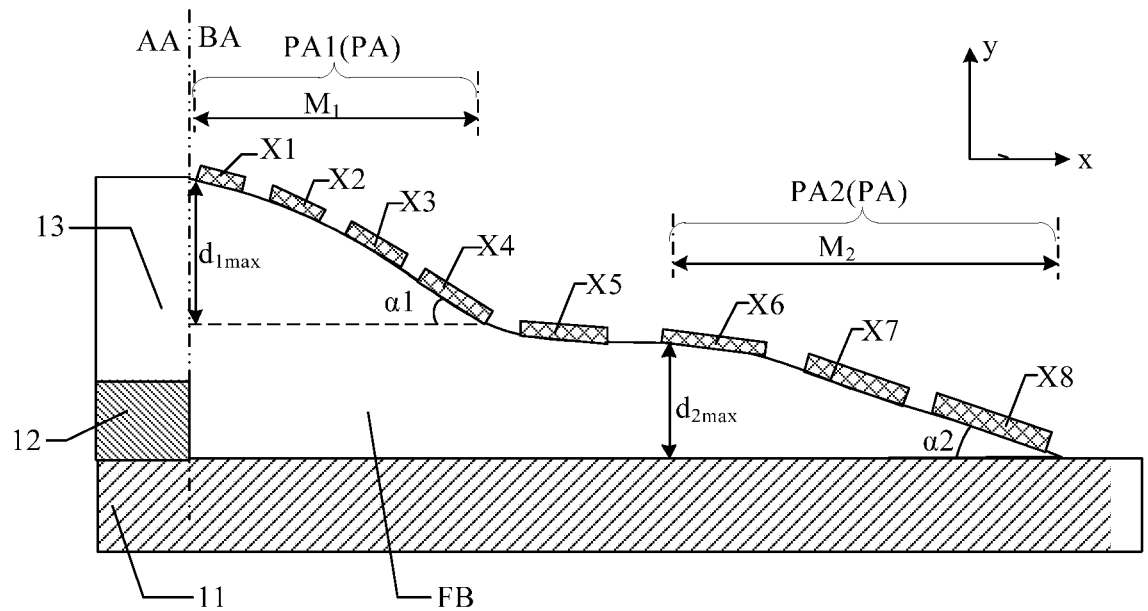
FIG. 13 illustrates another exemplary cross-sectional view at cross section AA' of the exemplary display panel illustrated in FIG. 1, consistent with the disclosed embodiments of the present disclosure.

FIG. 13 illustrates another exemplary cross-sectional view at cross section AA' of the exemplary display panel illustrated in FIG. 1. In one embodiment, as shown in FIG. 13, the touch signal lines include eight touch signal lines in sequence, and the line widths of the touch signal lines gradually increase. The first to the fourth touch signal lines are located in the first subarea PA1, and the sixth to the eighth touch signal lines are located in the second subarea PA2. In one embodiment, the line-width difference between any two adjacent touch signal lines in the first subarea PA1 is greater than the line-width difference between any two adjacent touch signal lines in the second subarea PA2. For example, the line width of the first touch signal line X1 is $L_1$, the line width of the second touch signal line X2 is $L_2$, and $|L_2-L_1|=\Delta D_1$. The line width of the sixth touch signal line X6 is $L_6$, the line width of the seventh touch signal line X7 is $L_7$, and $|L_7-L_6|=\Delta D_2$, where $\Delta D1 > \Delta D2$.

The spacing difference between any two adjacent spacings in the first subarea PA1 is greater than the spacing difference between any two adjacent spacings in the second subarea PA2. In the first subarea PA1, the spacing between the first touch signal line X1 and the second touch signal lines X2 is $S_1$, and the spacing between the second touch signal lines X2 and the third touch signal lines X3 is $S_2$. A spacing difference between $S_2$ and $S_1$ is defined by $|S_2-S_1|=\Delta S_1$. In the second subarea PA2, the spacing between the sixth touch signal line X6 and the seventh touch signal line X7 is $S_6$, and the spacing between the seventh touch signal line X7 and the eighth touch signal line X8 is $S_7$. A distance difference between $S_8$ and $S_7$ is defined by $|S_8-S_7|=\Delta S_2$, where $\Delta S_1 > \Delta S_2$.

In one embodiment, the slope angle of the first subarea is greater than the slope angle of the second subarea. Thus, the first subarea is steeper than the second subarea, and is a steeper region, and the second subarea is a relatively flat region. Due to the large slope angle in the steeper region, bending stress generated in the steeper region may be larger when the display panel is bent. In the present disclosure, $\Delta D_1 > \Delta D_2$ and $\Delta S_1 > \Delta S_2$. The line-width difference between the adjacent two touch signal lines designed in the steeper region is greater than the line-width difference between the adjacent two touch signal lines in the relatively flat region. The spacing difference between the adjacent two spacings in the steeper region is greater than the spacing difference between the adjacent two spacings in the relatively flat region. It may be ensured that, compared to the relatively flat region, no matter whether the line widths of the touch signal lines gradually decrease or gradually increase, less touch signal lines are disposed in the steeper region. Accordingly, number of touch signal lines that are subject to bending stresses generated in the steeper region in a bending state may be small, and the reliability of the touch performance may thus be improved.

In one embodiment, in the direction from the display area to the non-display area, the width of the first subarea is equal to the width of the climbing area. That is, the entire climbing area is the first subarea, and the line width change of the touch signal lines in the climbing area is consistent. In the direction from the display area to the non-display area, the line width of the touch signal line may gradually decrease, or gradually increase.

In one embodiment, in the climbing area, in the direction from the display area to the non-display area, the line widths of the touch signal lines gradually increase. That is, touch signal lines disposed at a place closer to the edge of the inorganic encapsulation layer may have a larger line width. Since a touch signal line with a larger width may have a stronger breakage resistance, a breakage risk of touch signal lines caused by edge cracks of the inorganic encapsulation layer at a side away from the display area may be reduced. Accordingly, breakage of the touch signal line caused by concentration of internal stress at the edge of the inorganic encapsulation layer may be avoided, and thus the reliability of touch performance may be ensured.

In one embodiment, in the climbing area, in the direction from the display area to the non-display area, the line widths of the touch signal lines gradually decrease. That is, a touch signal line disposed at a position of the thin film encapsulation layer with a larger thickness may have a larger line width. A breakage risk of touch signal lines due to a bending stress at a position of the thin film encapsulation layer with a larger thickness during a bending process may be reduced. Accordingly, breakage of the touch signal lines caused by a bending stress at a position where the thin film encapsulation layer has a larger thickness during a bending process may be avoided, and thus the reliability of the touch performance may be ensured.

With continued reference to FIG. 1, in the direction from the display area AA to the non-display area BA, the width M of the climbing section PA is in a range of approximately 100 $\mu m \leq M \leq 1000$ $\mu m$. When the width of the climbing section is too large, the climbing section may occupy a large space in the non-display area, and the narrowing of the non-display area may not be achieved. When the width of the climbing section is too small, a space in the non-display area occupied by the climbing section may be too small, and disposing touch signal lines on the climbing section may be difficult. Also, an overall slope of the climbing section may be large, and thus bending stresses generated at the climbing section during a bending process may be large. Accordingly, a breakage risk of the touch signal lines due to bending stress may increase.

In the present disclosure, the width M of the climbing section is in a range of approximately 100 $\mu m \leq M \leq 1000$ $\mu m$. Accordingly, the width of the climbing section may not be too large, and thus narrowing of the non-display area may be achieved. Also, the climbing section has a certain width, and a plurality of touch signal lines may be disposed on the climbing section. Meanwhile, a slope angle of the climbing section may not be too large, and thus a breakage risk of the touch signal lines due to bending stress may decrease.

Figure 14:
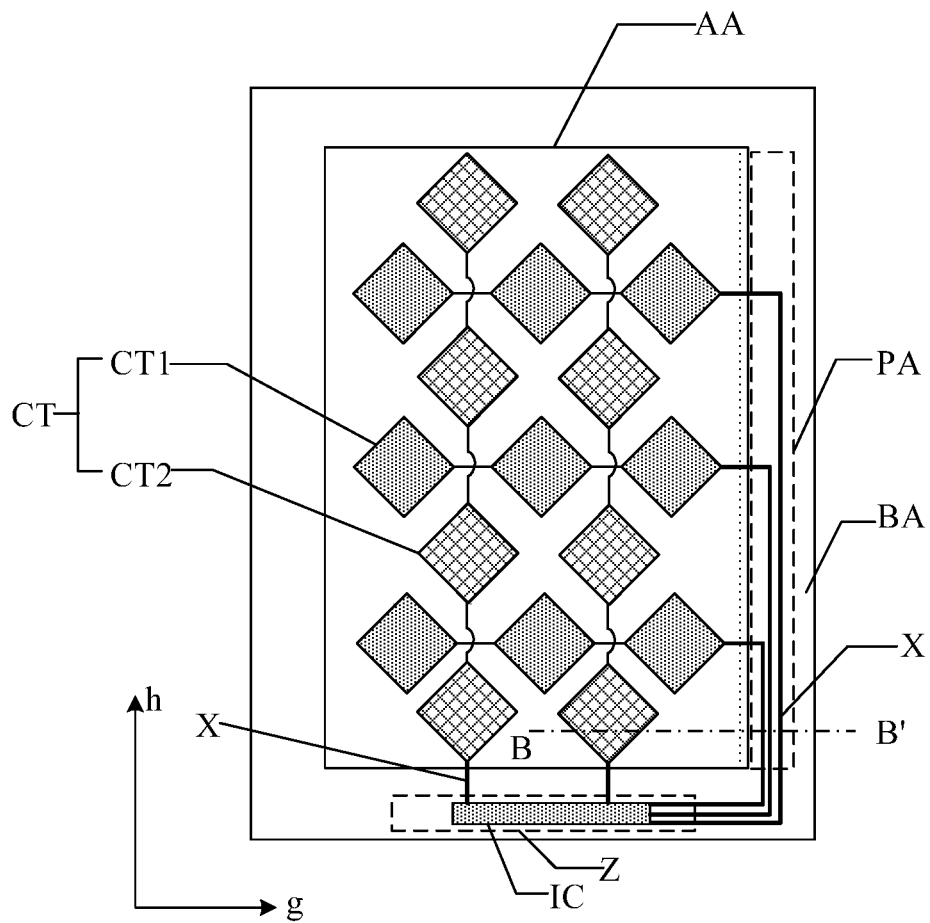
FIG. 14 illustrates a top view of an exemplary implementation of an exemplary display panel consistent with the disclosed embodiments of the present disclosure.
Figure 15:
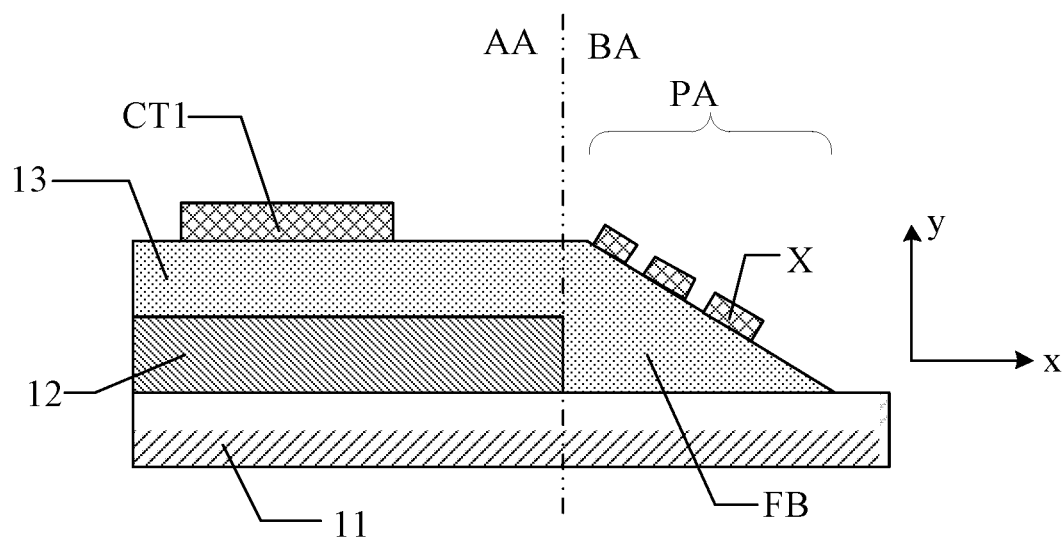
FIG. 15 illustrates an exemplary cross-sectional view at cross section BB' of the exemplary display panel illustrated in FIG. 14, consistent with the disclosed embodiments of the present disclosure.

FIG. 14 illustrates a top view of an exemplary implementation of an exemplary display panel consistent with the disclosed embodiments, and FIG. 15 illustrates a cross-sectional view at cross section BB' of the exemplary display panel illustrated in FIG. 14. In one embodiment, as shown in FIG. 14 and FIG. 15, the display panel includes touch electrodes CT on a side of the thin film encapsulation layer 13 away from the display layer 12. One touch electrode is electrically connected to one touch signal line X. The touch electrodes CT include first touch electrodes CT1 arranged in a second direction g and second touch electrodes CT2 arranged in a third direction h, where the second direction g and the third direction h intersect.

In one embodiment, as shown in FIG. 14, the touch electrodes may have a rhombus shape. The first touch electrode CT1 and the second touch electrode CT2 are insulated from each other. A plurality of first touch control electrodes CT1 located in a same row in the second direction g is electrically connected and connected to a same touch signal line X. The touch signal line X connected to the first touch electrodes CT1 is routed in the climbing area PA, and then connected to a driving chip IC. A plurality of second touch electrodes CT2 in a same column in the third direction h is electrically connected and connected to a same touch signal line X. The touch signal line X connected to the second touch electrodes CT2 is routed in a lower non-display area, and connected directly to the driver chip IC.

In some other embodiments, the touch electrodes may have a strip shape.

It should be noted that, in FIG. 14, the touch signal lines electrically connected to the first touch electrodes are all routed in the climbing area at one side of the display area. In some other embodiments, each of two non-display areas at two sides of the display area in the second direction g may have a climbing area, and the touch signal lines electrically connected to the first touch electrodes may be separately disposed in the two climbing areas.

Figure 16:
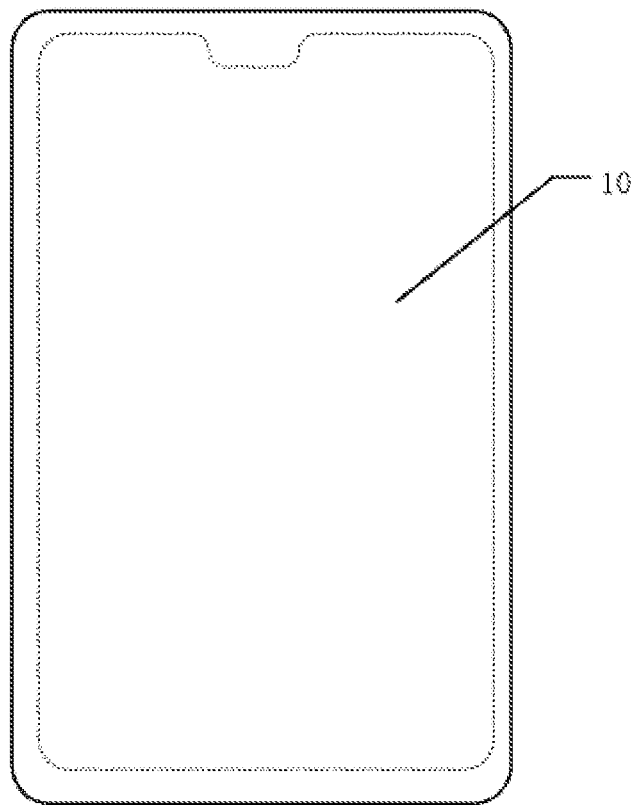
FIG. 16 illustrates an exemplary display device consistent with the disclosed embodiments of the present disclosure.

FIG. 16 illustrates an exemplary display device consistent with the disclosed embodiments. The present disclosure also provides a display device. As shown in FIG. 16, the display device includes a display panel 10 provided by any one of the embodiments of the present disclosure. The display device may be any one of electronic products having a display function, including but not limited to the following categories: television, notebook computer, desktop display, tablet computer, digital camera, mobile phone, smart bracelet, smart glasses, on-board display, medical equipment, industrial equipment, touch interactive terminals, etc.

As disclosed, the technical solutions of the present disclosure have the following advantages.

In a display panel provided by the present disclosure, at least a part of the touch signal lines is disposed on a climbing section of a thin film encapsulation layer. The climbing section is a structure inevitably formed in a manufacturing process for the thin film encapsulation layer. Since the touch signal lines are disposed on the climbing section, a width of the non-display area occupied by the climbing section and the touch signal lines in a direction from the display area to the non-display area may be reduced, and thus narrowing of the non-display area may be achieved.

In the present disclosure, the touch signal lines are disposed in a first subarea of the climbing region. In the first subarea, in a direction from the display area to the non-display area, line widths of the touch signal lines may gradually increase. That is, a touch signal line disposed at a place closer to an edge of the inorganic encapsulation layer may have a larger line width. Since a touch signal line with a larger width may have a stronger breakage resistance, a breakage risk of touch signal lines caused by edge cracks of the inorganic encapsulation layer at a side away from the display area may be reduced. Accordingly, breakage of touch signal lines caused by concentration of internal stress at the edge of the inorganic encapsulation layer may be avoided, and reliability of touch performances may thus be ensured.

In the first subarea, in the direction from the display area to the non-display area, the line widths of the touch signal lines may gradually decrease. That is, a touch signal line disposed at a position of the thin film encapsulation layer with a larger thickness may have a larger line width. A breakage risk of a touch signal line due to bending stress at a position of the thin film encapsulation layer with a larger thickness during a bending process may be reduced. Accordingly, breakage of a touch signal line caused by bending stress at a position where the thin film encapsulation layer has a larger thickness during a bending process may be avoided, and the reliability of touch performances may thus be ensured.

The embodiments disclosed herein are exemplary only and not limiting the scope of this disclosure. Various combinations, alternations, modifications, or equivalents to the technical solutions of the disclosed embodiments can be obvious to those skilled in the art and can be included in this disclosure. Without departing from the spirit and scope of this disclosure, such other modifications, equivalents, or improvements to the disclosed embodiments are intended to be encompassed within the scope of the present disclosure.

What is claimed is:

1. A display panel, comprising a display area and a non-display area, wherein the non-display area includes a climbing area, the display panel further comprising:
   an array substrate;
   a display layer, disposed on the array substrate and located in the display area;
   a thin film encapsulation layer, located at a side of the display layer away from the array substrate and extending from the display area to the non-display area; and
   touch signal lines, located at a side of the thin film encapsulation layer away from the display layer, wherein:
   the thin film encapsulation layer includes a climbing section located in the climbing area;
   in a direction from the display area to the non-display area, a thickness of the climbing section in a first direction gradually decreases, the first direction being perpendicular to a plane where the display panel is located;
   at least a part of the touch signal lines is disposed on the climbing section;
   in the climbing area, the touch signal lines are sequentially arranged in the direction from the display area to the non-display area;
   a width of one touch signal line in a direction perpendicular to an extending direction of the touch signal line is a line width of the touch signal line; and
   the climbing area includes at least one first sub-area, and in the first sub-area, in the direction from the display area to the non-display area, line widths of the touch signal lines gradually change,
   wherein the line widths of the touch signal lines gradually change by a ratio determined based on a slope angle of the climbing section.

2. The display panel according to claim 1, wherein:
   in the first sub-area, in the direction from the display area to the non-display area, spacings between two adjacent touch signal lines gradually change; and
   a change rule of the line widths is opposite to a change rule of the spacings.

3. The display panel according to claim 1, wherein, in the first sub-area, in the direction from the display area to the non-display area, the line widths of the touch signal lines gradually increase.

4. The display panel according to claim 3, wherein:
   in the first sub-area, in the direction from the display area to the non-display area, a width of the climbing section is $M_1$, a height of a slope of the climbing section in the first direction is $d_{max}$, and $\tan \alpha 1 = d_{max}/M_1$, where $\alpha 1$ is the slope angle of the climbing section; and
   in the first sub-area, in the direction from the display area to the non-display area, the touch signal lines sequentially include a first touch signal line, a second touch signal line, a third touch signal line to an n-th touch signal line, which respectively have line widths of $L_1$, $L_2$, $L_3$ to $L_n$, wherein $L_m - L_{m-1} = L_{m-1} * q * \tan \alpha 1$, $0 < q * \tan \alpha 1 < 1$, $2 \leq m \leq n$, q is a positive number, and m and n are integers.

5. The display panel according to claim 3, wherein in the first sub-area, in the direction from the display area to the non-display area, spacings between two adjacent touch signal lines gradually decrease.

6. The display panel according to claim 5, wherein:
   in the first sub-area, in the direction from the display area to the non-display area, a width of the climbing section is $M_1$, a height of a slope of the climbing section in the first direction is $d_{max}$, $\tan \alpha 1 = d_{max}/M_1$, where $\alpha 1$ is the slope angle of the climbing section;
   in the first sub-area, in the direction from the display area to the non-display area, the touch signal lines sequentially include a first touch signal line, a second touch signal line, a third touch signal line to the n-th touch signal line; and
   a spacing between an (m−1)-th touch signal line and an m-th touch signal line is $S_{m-1}$, and a spacing between the m-th touch signal line and an (m+1)-th touch signal line is $S_m$, wherein $S_{m-1} - S_m = S_{m-1} * q * \tan \alpha 1$, $0 < q * \tan \alpha_1 < 1$, $2 \leq m \leq n$, q is a positive number, and m and n are integers.

7. The display panel according to claim 1, wherein, in the first sub-area, in the direction from the display area to the non-display area, the line widths of the touch signal lines gradually decrease.

8. The display panel according to claim 7, wherein:
in the first sub-area, in the direction from the display area to the non-display area, a width of the climbing section is $M_1$, a height of a slope of the climbing section in the first direction is $d_{max}$, and $\tan \alpha 1 = d_{max}/M_1$, where $\alpha 1$ is the slope angle of the climbing section; and
in the first sub-area, in the direction from the display area to the non-display area, the touch signal lines sequentially include a first touch signal line, a second touch signal line, a third touch signal line to an n-th touch signal line, and correspondingly, the line widths of the touch signal lines are $L_1$, $L_2$, $L_3$ to $L_n$ respectively, wherein $L_{m-1} - L_m = *q*\tan \alpha 1$, $0 < q*\tan \alpha_1 < 1$, $2 \leq m \leq n$, q is a positive number, and m and n are integers.

9. The display panel according to claim 7, wherein, in the first sub-area, in the direction from the display area to the non-display area, spacings between two adjacent touch signal lines gradually increase.

10. The display panel according to claim 9, wherein:
in the first sub-area, in the direction from the display area to the non-display area, a width of the climbing section is $M_1$, a height of a slope of the climbing section in the first direction is $d_{max}$, and $\tan \alpha 1 = d_{max}/M_1$, where $\alpha 1$ is the slope angle of the climbing section;
in the first sub-area, in the direction from the display area to the non-display area, the touch signal lines sequentially include a first touch signal line, a second touch signal line, a third touch signal line to an n-th touch signal line; and
a spacing between an (m−1)-th touch signal line and an m-th touch signal line is $S_{m-1}$, and a spacing between the m-th touch signal line and an (m+1)-th touch signal line is $S_m$, wherein $S_m - S_{m-1} = S_{m-1}*q*\tan \alpha 1$, $0 < q*\tan \alpha_1 < 1$, $2 \leq m \leq n$, q is a positive number, and m and n are integers.

11. The display panel according to claim 1, wherein:
the climbing area further includes a second sub-area;
in the first sub-area, in the direction from the display area to the non-display area, a width of the climbing section is $M_1$, a height of a slope of the climbing section in the first direction is $d_{1max}$, and $\tan \alpha 1 = d_{1max}/M_1$, where $\alpha 1$ is a slope angle of the climbing section in the first sub-area; and
in the second sub-area, in the direction from the display area to the non-display area, a width of the climbing section is $M_2$, a height of is a slope of the climbing section in the first direction is $d_{2max}$, and $\tan \alpha 2 = d_{2max}/M_2$, where $\alpha 2$ is a slope angle of the climbing section in the second sub-area;
wherein:
$\alpha 1 > \alpha 2$, and
change trends of the line widths of the touch signal lines in the first sub-area and in the second sub-area are consistent with each other.

12. The display panel according to claim 11, wherein:
in the first sub-area, in the direction from the display area to the non-display area, a line-width difference between two adjacent touch signal lines is $\Delta D_1$, and a spacing difference between two adjacent spacings is $\Delta S_1$; and
in the second sub-area, in the direction from the display area to the non-display area, a line-width difference between two adjacent touch signal lines is $\Delta D_2$, and a spacing difference between two adjacent spacings is $\Delta S_2$,
wherein $\Delta D_1 > \Delta D_2$ and $\Delta S_1 > \Delta S_2$.

13. The display panel according to claim 1, wherein, in the direction from the display area to the non-display area, a width of the first sub-area is equal to a width of the climbing area.

14. The display panel according to claim 1, wherein, in the direction from the display area to the non-display area, a width of the climbing section is M, and M is in a range of approximately $100 \, \mu m \leq M \leq 1000 \, \mu m$.

15. The display panel according to claim 1, further comprising touch electrodes on the side of the thin film encapsulation layer away from the display layer, wherein:
one touch electrode is electrically connected to one touch signal line;
the touch electrodes include first touch electrodes arranged in a second direction and second touch electrodes arranged in a third direction; and
the second direction intersects the third direction.

16. The display panel according to claim 1, wherein the thin film encapsulation layer includes at least one organic encapsulation layer and at least one inorganic encapsulation layer.

17. The display panel according to claim 16, wherein, in the display area, in the first direction, a thickness of the organic encapsulation layer is d, and d is in a range of approximately $4 \, \mu m \leq d \leq 16 \, \mu m$.

18. A display device, comprising:
a display panel, comprising:
a display area and a non-display area, wherein the non-display area includes a climbing area;
an array substrate;
a display layer, disposed on the array substrate and located in the display area;
a thin film encapsulation layer, located at a side of the display layer away from the array substrate and extending from the display area to the non-display area; and
touch signal lines, located at a side of the thin film encapsulation layer away from the display layer,
wherein:
the thin film encapsulation layer includes a climbing section located in the climbing area;
in a direction from the display area to the non-display area, a thickness of the climbing section in a first direction gradually decreases, the first direction being perpendicular to a plane where the display panel is located;
at least a part of the touch signal lines is disposed on the climbing section;
in the climbing area, the touch signal lines are sequentially arranged in the direction from the display area to the non-display area;
a width of one touch signal line in a direction perpendicular to an extending direction of the touch signal line is a line width of the touch signal line; and
the climbing area includes at least one first sub-area, and in the first sub-area, in the direction from the display area to the non-display area, line widths of the touch signal lines gradually change,
wherein the line widths of the touch signal lines gradually change by a ratio determined based on a slope angle of the climbing section.

* * * * *